United States Patent
Goda et al.

(10) Patent No.: US 9,123,851 B2
(45) Date of Patent: Sep. 1, 2015

(54) SEMICONDUCTOR LIGHT EMITTING ELEMENT

(75) Inventors: Takahiko Goda, Anan (JP); Yasuhisa Kotani, Anan (JP)

(73) Assignee: NICHIA CORPORATION, Anan-shi (JP)

(*) Notice: Subject to any disclaimer, the term of this patent is extended or adjusted under 35 U.S.C. 154(b) by 0 days.

(21) Appl. No.: 14/234,842

(22) PCT Filed: Jun. 13, 2012

(86) PCT No.: PCT/JP2012/065146
§ 371 (c)(1),
(2), (4) Date: Jan. 24, 2014

(87) PCT Pub. No.: WO2013/015035
PCT Pub. Date: Jan. 31, 2013

(65) Prior Publication Data
US 2014/0166980 A1    Jun. 19, 2014

(30) Foreign Application Priority Data
Jul. 26, 2011    (JP) ................................ 2011-162773

(51) Int. Cl.
| | |
|---|---|
| H01L 29/36 | (2006.01) |
| H01L 31/00 | (2006.01) |
| H01L 33/06 | (2010.01) |
| H01L 33/32 | (2010.01) |
| H01S 5/34  | (2006.01) |

(Continued)

(52) U.S. Cl.
CPC ................ *H01L 33/06* (2013.01); *H01L 33/32* (2013.01); *H01S 5/2009* (2013.01); *H01S 5/3407* (2013.01); *H01S 5/34333* (2013.01)

(58) Field of Classification Search
CPC ..... H01L 33/32; H01L 33/06; H01S 5/34333; H01S 5/3407
USPC .......................................................... 257/14
See application file for complete search history.

(56) References Cited

U.S. PATENT DOCUMENTS

| | | | |
|---|---|---|---|
| 8,575,592 B2* | 11/2013 | Bergmann et al. ............... 257/13 |
| 2002/0053676 A1 | 5/2002 | Kozaki | |
| 2006/0108603 A1 | 5/2006 | Uemura et al. | |

(Continued)

FOREIGN PATENT DOCUMENTS

| | | |
|---|---|---|
| EP | 2204854 A1 | 7/2010 |
| JP | 2002-223042 A | 8/2002 |

(Continued)

OTHER PUBLICATIONS

Extended European Search Report of the corresponding European Patent Application No. 12817610.4, dated Mar. 19, 2015.

*Primary Examiner* — Jarrett Stark
(74) *Attorney, Agent, or Firm* — Global IP Counselors, LLP

(57) ABSTRACT

A semiconductor light emitting element includes an n-side semiconductor layer, an active layer, and a p-side semiconductor layer stacked in this order on a substrate. The active layer includes a multiple quantum well structure which includes a plurality of barrier layers and a plurality of well layers adjacent to the barrier layers. Among the barrier layers, a final barrier layer disposed closest to the p-side semiconductor layer and one or more barrier layers adjacent to the final barrier layer via the well layers respectively has a greater thickness than a thickness of a barrier layer on a side close to the n-side semiconductor layer.

18 Claims, 3 Drawing Sheets

(51) Int. Cl.
*H01S 5/343* (2006.01)
*H01S 5/20* (2006.01)

(56) References Cited

U.S. PATENT DOCUMENTS

| | | | |
|---|---|---|---|
| 2008/0069164 A1* | 3/2008 | Edamura et al. | 372/45.012 |
| 2008/0093593 A1 | 4/2008 | Ryu | |
| 2009/0152586 A1 | 6/2009 | Lee et al. | |
| 2010/0080257 A1* | 4/2010 | Lee et al. | 372/45.012 |
| 2010/0288998 A1* | 11/2010 | Kikuchi et al. | 257/13 |
| 2010/0288999 A1 | 11/2010 | Kikuchi et al. | |
| 2012/0056157 A1* | 3/2012 | Hikosaka et al. | 257/13 |
| 2013/0001512 A1* | 1/2013 | Kotani | 257/13 |

FOREIGN PATENT DOCUMENTS

| | | |
|---|---|---|
| JP | 2003-031902 A | 1/2003 |
| JP | 2004-104157 A | 4/2004 |
| JP | 2006-108585 A | 4/2006 |
| JP | 2007-035781 A | 2/2007 |
| JP | 2008-103711 A | 5/2008 |
| JP | 2008-124498 A | 5/2008 |
| JP | 2009-099893 A | 5/2009 |
| JP | 2009-105423 A | 5/2009 |

* cited by examiner

SEMICONDUCTOR LIGHT EMITTING ELEMENT

CROSS REFERENCE TO RELATED APPLICATIONS

This application claims priority to Japanese Patent Application No. 2011-162773 filed on Jul. 26, 2011. The entire disclosure of Japanese Patent Application No. 2011-162773 is hereby incorporated herein by reference.

BACKGROUND OF THE INVENTION

1. Technical Field

The present invention relates to a semiconductor light emitting element.

2. Background Art

With light emitting diodes (LEDs), semiconductor lasers (LDs), and the like, which are of semiconductor light emitting elements having an n-side semiconductor layer, an active layer, and a p-side semiconductor layer stacked in this order on a substrate, can generate emission of blue and green etc., which have drawn various research and development activities. Generally a method of manufacturing those semiconductor light emitting devices includes disposing a GaN layer on a foreign substrate via an intermediate layer such as a low-temperature buffer layer etc. so as to obtain a flat substrate surface and to decrease occurrence of penetrating pits extending from the foreign substrate, then stacking an n-side semiconductor layer, an active layer, and a p-side semiconductor layer on the GaN layer.

However, in such a method where a GaN layer is grown on a foreign substrate, numerous dislocations in GaN are transferred through the n-side semiconductor layer, the active layer into the p-side semiconductor layer. Particularly, in the case where the active layer contains In, crystal defects increase, resulting in a great drop in non-radiative recombination probability. Meanwhile, various attempts are proposed to obtain a semiconductor light emitting element of high luminosity and high light emitting efficiency, such as varying the thickness of the well layers, or setting the number of unit cycles of a barrier layer and a well layer in the active layer greater at the p-side semiconductor layer side than at the n-side semiconductor layer side (for example, in Japanese Unexamined Patent Application Publication No. 2009-99893A).

SUMMARY

However, once occurred in the stacked layer structure, such dislocations and defects cannot be easily reduced by further stacking semiconductor layers thereon. In addition, an increase of thickness of the well layers in the active layer or of the number of stacking tend to result in further increase of occurrence of dislocations and defects. As a result, due to the light emitting layer having high dislocations and crystal defects, a high light emitting efficiency cannot be obtained. Moreover, an increase of the thickness of the well layers or the number of stacking layers in the active layer which contains dislocations and defects may merely results in an increase of serial resistance component, which leads to a further increase in the forward voltage Vf, hindering the achievement of a higher efficiency.

The present invention is devised to solve the above problems, and therefore, is aimed at providing a semiconductor light emitting element which can reduce deterioration of the light emitting efficiency attributed to dislocations and crystal defects and also reduce serial resistance component, so that a further improvement in the light emitting efficiency can be realized.

A semiconductor light emitting element according to an aspect of the present invention includes an n-side semiconductor layer, an active layer, and a p-side semiconductor layer stacked in this order on a substrate the active layer having a multiple quantum well structure including a plurality of barrier layers and a plurality of well layers adjacent to the barrier layers. Among the barrier layers, a final barrier layer disposed closest to the p-side semiconductor layer and one or more barrier layers adjacent to the final barrier layer via the well layers respectively having a greater thickness than a thickness of a barrier layer on a side close to the n-side semiconductor layer.

A semiconductor light emitting element according to another aspect of the present invention includes an n-side semiconductor layer, an active layer, and a p-side semiconductor layer stacked in this order on a substrate, the active layer having a multiple quantum well structure including a plurality of unit cycles of a barrier layer and a well layer adjacent to the barrier layer. Among the plurality of unit cycles, a unit cycle disposed closest to the p-side semiconductor layer and one or more unit cycles adjacent to the unit cycle having a thickness greater than a thickness of a unit cycle disposed on a side close to the n-side semiconductor layer.

The semiconductor light emitting elements as described above preferably have one or more features illustrated below. The active layer includes a plurality of unit cycles including the unit cycle disposed on the side close to the n-side semiconductor layer and having a same thickness and adjacent with each other, and a plurality of unit cycles including the unit cycle disposed on the side close to the p-side semiconductor layer and having a same thickness and adjacent with each other, while a total number of unit cycles including the unit cycle disposed on the side close to the n-side semiconductor layer is greater than a total number of unit cycles including the unit cycle disposed on the side close to the p-side semiconductor layer. The barrier layer in the unit cycle disposed on the side close to the p-side semiconductor layer has a greater thickness than the barrier layer in the unit cycles disposed on the side close to the n-side semiconductor layer. The barrier layer in the unit cycle disposed on the side close to the p-side semiconductor layer has a thickness of 1.5 times or greater with respect to a thickness of the well layer in the unit cycle disposed on the side close to the p-side semiconductor layer. The active layer includes the barrier layer disposed on the side close to the n-side semiconductor layer, a plurality of barrier layers having a same thickness as the barrier layer, and adjacent to the barrier layer via a well layer, the barrier layer disposed on the side close to the p-side semiconductor layer, and a plurality of barrier layers having a same thickness as the barrier layer, and adjacent to the barrier layer via a well layer, while a number of the barrier layers disposed on the side close to the n-side semiconductor layer and having a same thickness with each other is greater than a number of the barrier layers disposed on the side close to the p-side semiconductor layer and having a same thickness with each other. The final barrier layer has a thickness 1.5 times or greater than the thickness of the adjacent well layer.

The barrier layers and the well layers are alternately stacked.

The well layers are made of undoped InGaN, and the barrier layers are made of an undoped nitride semiconductor having a larger band gap energy than the well layers.

The well layers are made of an undoped InGaN, and the barrier layers are made of an undoped GaN, an undoped AlGaN, or an undoped InGaN having a lower In mixed crystal ratio than the well layers.

The well layers have an In mixed crystal ratio of 0.1 or greater and 0.4 or less.

A cap layer having a different composition than the well layers and the barrier layers is between the well layers and the barrier layers.

Effect of the Invention

With the semiconductor light emitting element according to the present invention, deterioration of the light emitting efficiency attributed to dislocations and crystal defects can be reduced and serial resistance component can be decreased, so that further improvement in the light emitting efficiency can be realized.

DETAILED DESCRIPTION OF THE EMBODIMENTS

Figure 1:
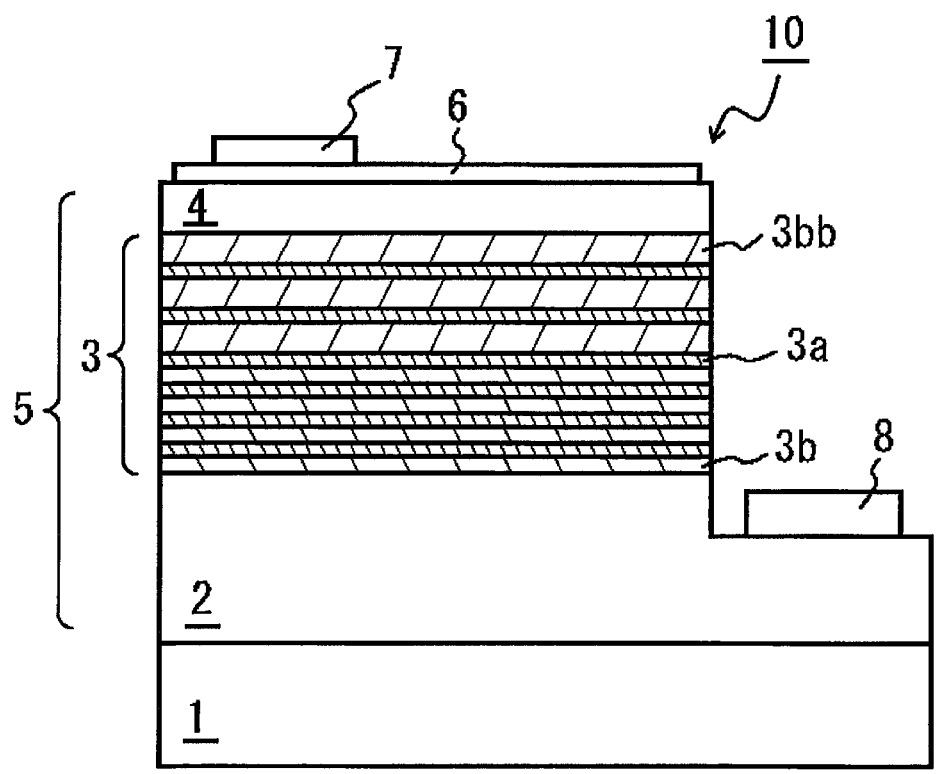
FIG. 1 is a schematic cross sectional view illustrating a structure of a semiconductor light emitting element according to an embodiment of the present invention.

A semiconductor light emitting element according to the present invention is so-called an "LED", and, as shown in FIG. 1, mainly, provided with a semiconductor layer 5 in which an n-side semiconductor layer 2, an active layer 3, and a p-side semiconductor layer 4 are stacked in this order on a substrate 1. The substrate 1 is not necessarily present in a final stage. Further, the p-side semiconductor layer 4 has a full-surface electrode 6 connected to an approximately entire upper surface thereof and a p-electrode 7 connected to a part of the full-surface electrode 6. Also, a part of the p-side semiconductor layer 4 and active layer 3 and a part of the n-side semiconductor layer 2 are removed to expose an n-type contact layer which is a constituent of the n-side semiconductor layer 2, and an n-electrode 8 is connected to the exposed surface.

Although not shown, a protective layer is formed on a part of the substrate 1, the side surfaces and upper surface of the semiconductor layer 5, and when appropriate, the side surfaces and a part of the upper surfaces of the p-electrode 7 and the n-electrode 8. In the specification, the term "a part" includes both a part (a part of a region) within a surface and a part in a thickness direction.

The n-side semiconductor layer 2, the active layer 3, and the p-side semiconductor layer 4 are, for example, formed by a compound semiconductor represented by formula (A): $In_xAl_yGa_{1-x-y}N$ ($0 \leq x \leq 1$, $0 \leq y \leq 1$, $0 \leq x+y \leq 1$). In addition to this, a part of group-III element may be substituted with B, or as a group-V element, a part of N may be substituted with P, As.

The n-side semiconductor layer 2 is a collective term for a single layer or a stacked layer including at least one group-IV element or group-VI element such as Si, Ge, Sn, S, O, Ti, Zr, and Cd as an n-type dopant, and is at one side with respect to the active layer 3. Among those, Si, Sn is preferable for an n-type dopant. The p-side semiconductor layer 3 is a collective term for a single layer or a stacked layer including at least one element such as Mg, Zn, Be, Mn, Ca, and Sr as a p-type dopant, and is at the other side with respect to the active layer 3.

Active Layer 3

The active layer 3 has a multiquantum well structure. The multiquantum well structure includes a plurality of unit cycles U which is made of one barrier layer and one well layer adjacent to the barrier layer. In other words, the multiquantum well structure includes a barrier layer, one or more barrier layers adjacent to the barrier layer via a well layer, and two or more well layers. The number of the unit cycles, the number of the barrier layers and the well layers are not specifically limited, and, respectively, for example, 50 or less is suitable, and 30 or less is preferable, and 20 or less is more preferable. Among those, about 7 to 15 is further preferable.

The layer adjacent to the n-side semiconductor layer and the p-side semiconductor layer can be either a barrier layer or a well layer, but the barrier layers are preferably adjacent to the n-side semiconductor layer and p-side semiconductor layer respectively. The barrier layer which is in contact with the n-side semiconductor layer can be called a first barrier layer and the barrier layer adjacent to the p-side semiconductor layer can be called a final barrier layer.

The well layer constituting the active layer 3 preferably contains In in the formula (A), that is, the mixed crystal ratio (x) of In is preferably about 0.4 or less, more preferably about 0.3 or less. Also, about 0.1 or more is suitable. The mixed crystal ratio of In is a factor to determine the emission wavelength of the semiconductor light emitting element, and the present invention is particularly advantageously applicable for a light emitting element of a short wavelength side which has a low In mixed crystal rate.

Generally, the barrier layers and the well layers have different compositions. For example, the barrier layers are preferably made of an undoped nitride semiconductor having a band gap energy larger than that of the well layers. More specifically, in the case where the well layers are made of $In_jGa_{1-j}N$ ($0 \leq j < 1$), the barrier layers can be GaN, AlGaN, or InGaN which have an In mixed crystal ratio smaller than that of the well layers. In the case where the barrier layers are made of InGaN having an In mixed crystal ratio smaller than that of the well layers, the In mixed crystal ratio is compared by an average value, the In mixed crystal ratio is compared by an average value of all the well layers and all the barrier layers respectively. In the active layer, generally, the well layers have a thickness in a range of about 1 to 8 nm, preferably about 1.5 to 5 nm, and the barrier layers have a thickness in a range of about 1.5 to 16 nm, preferably about 2 to 10 nm. Generally, the barrier layers suitably have a thickness of about 1.5 times or greater than that of the well layers, and two times or greater is preferable. Particularly, the final barrier layer suitably has a thickness of about 1.5 times or greater than that of the adjacent well layer, and preferably has a thickness of two times or greater. Forming the barrier layers with a greater thickness than the well layers allows to compensate the possible defects which may occur due to a mixed crystal of In, further, due to an increase in the In mixed crystal ratio, and thus, well layers of good quality, furthermore, an active layer of good quality can be obtained.

The well layers may have various composition and/or thickness, but it is preferable that at least the component or the thickness, preferably both the component and the thickness are constant. In the case where the composition and the thickness of the well layers are constant, the wavelength of the light emitted from the active layer becomes stable, and the amount of change in the wavelength associated with changing in the wavelength half-width, electric current and temperature becomes stable, that is, the amount of change in the wavelength is reduced and the relative output power in a high temperature with respect to the output power at room-temperature is improved.

As for the barrier layers, it is suitable that at least the barrier layer disposed closest to the p-side semiconductor layer (hereinafter, this barrier layer is referred to as a final barrier layer) and one or more barrier layers adjacent to the final barrier layer via well layers have greater thicknesses than a barrier layer on a side close to the n-side semiconductor layer. Here, the expression "barrier layers disposed on a side close to the n-side semiconductor layer" indicates any barrier layers among the barrier layers which are disposed on a side close to the n-side semiconductor layer than the center of the active layer in its total thickness. Accordingly, the final barrier layer and one or more barrier layers adjacent to the final barrier layers via the well layers respectively are needed to have greater thicknesses than any barrier layers disposed on a side close to the n-side semiconductor layer, and in the case where the first barrier layer adjacent to the n-side semiconductor layer is present, preferably has a greater thickness with respect to any of the barrier layers disposed at the n-side semiconductor layer side except for the first barrier layer. In the case where the first barrier layer is present, the final barrier layer preferably has a greater thickness also with respect to first barrier layer.

The final barrier layer has a greater thickness than the barrier layer disposed on the side close to the n-side semiconductor layer and also the other barrier layers disposed adjacent to the final barrier layer via the well layers respectively on a side close to the p-side semiconductor layer has a greater thickness than the barrier layers disposed on a side close to the n-side semiconductor layer, the number of the barrier layers, that is, the number of the unit cycles can be set in the range described above. Here, the expression "barrier layers disposed on a side close to the final barrier layer (or on a side close to the p-side semiconductor layer)" refers to any barrier layer disposed on a side close to the p-side semiconductor layer with respect to the center of the total thickness of the active layer. In this case, the other barrier layers preferably have a thickness approximate (for example ±20%) to the final barrier layer.

The one or more other barrier layers disposed on a side close to the p-side semiconductor layer and having a thickness greater than the barrier layers disposed on a side close to the n-side semiconductor layer may be a barrier layer of a single unit cycle adjacent to the unit cycle including the final barrier layer, or may be the barrier layers of a plurality of unit cycles which are sequentially adjacent to the unit cycle including the final barrier layer. Alternatively, it may be a single barrier layer adjacent to the final barrier layer via a well layer, or may be a plurality of barrier layers sequentially adjacent to the final barrier layer via the well layers respectively.

Figure 2:
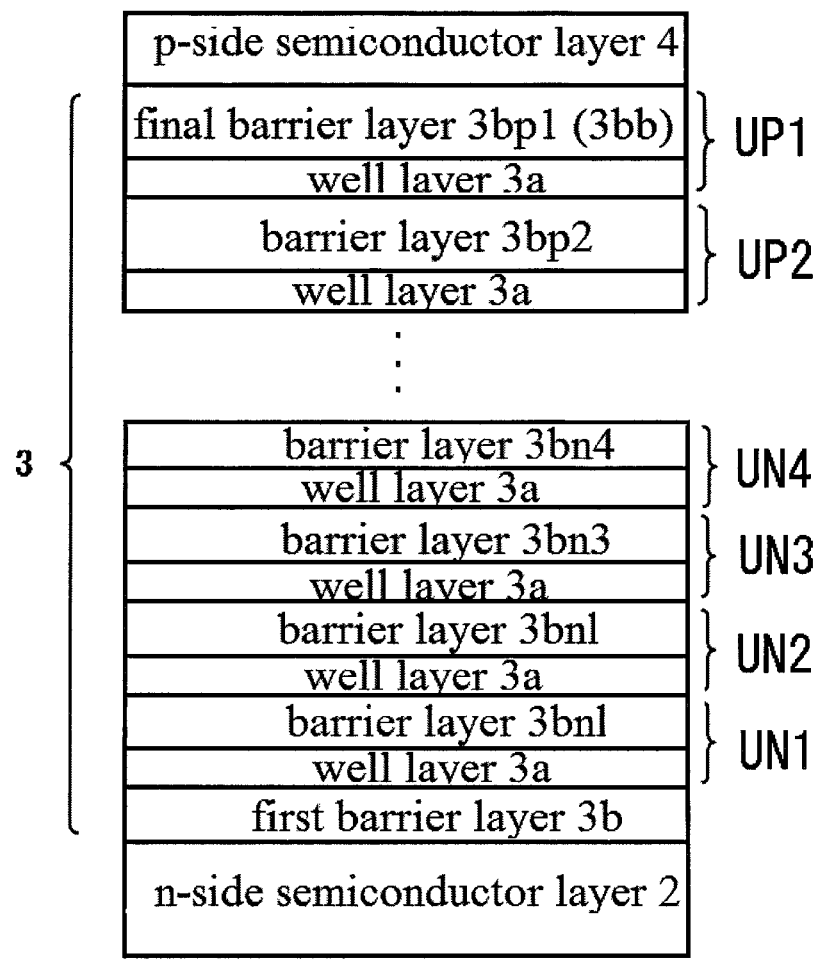
FIG. 2 is a schematic cross sectional view of main portions, for illustrating a structure of a semiconductor light emitting element according to an embodiment of the present invention.

For example, as shown in FIG. 2, in the active layer 3 between the n-side semiconductor layer 2 and the p-side semiconductor layer 4, in the case where, as sequentially from the first barrier layer 3b, the well layers 3a and the barrier layers 3bn1 to 3bn4, the well layer 3a and the barrier layer 3bp2, the well layer 3a and the barrier layer 3bp1 (that is the final barrier layer 3bb), the six cycles of the unit cycles UN1 to UN4 and the unit cycles UP2 to UP1 in this order from the first barrier layer 3b are disposed, it is preferable that the barrier layer 3bp1 (for example, the final barrier layer 3bb which is the closest to the p-side semiconductor layer) disposed on a side close to the p-side semiconductor layer and the barrier layer 3bp2 in the unit cycle UP2 adjacent to the unit cycle UP1 which includes this have a substantially the same thickness, and further, these barrier layers 3bp1, 3bp2 have a greater thickness than the barrier layer 3bn1 disposed on a side close to the n-side semiconductor layer. Also, it is more preferable that the barrier layers 3bp1, 3bp2 have a thickness further greater than the first barrier layer 3b. The barrier layer in a unit cycle UP disposed on a side close to the p-side semiconductor layer, for example, the barrier layer 3bp1 shown in FIG. 2 preferably has a thickness 1.5 times or greater, further 2 times or greater than the thickness of the well layer 3a in the unit cycle UP disposed on a side close to the p-side semiconductor layer.

Also, in a different perspective, it is preferable that, of the unit cycles, the unit cycle disposed closest to the p-side semiconductor layer and one or more unit cycles adjacent to this unit cycle have a thickness greater than the thickness of the unit cycles disposed on a side close to the n-side semiconductor layers. That is, it is suitable that, in FIG. 2, the total thickness of the unit cycle UP1 which includes the final barrier layer 3bb has a greater total thickness than any unit cycles (for example UN1, UN2 etc.) among the unit cycles disposed on a side close to the n-side semiconductor layer. As described above, generally, the well layers in the active layer preferably have a uniform composition and/or thickness, therefore as described above, the barrier layer 3bp1 (for example, the final barrier layer 3bb which is closest to the p-side semiconductor layer) disposed on a side close to the p-side semiconductor layer preferably has a thickness greater than the barrier layers (for example, 3bn1, 3bn2 etc). In other words, the barrier layers in the unit cycle disposed on a side close to the p-side semiconductor layer has a greater thickness than the barrier layer in any unit cycles disposed on a side close to the n-side semiconductor layer.

At the p-side semiconductor layer side, a greater degree of the thickness of the barrier layer is suitably about 200% or less, preferably about 150% or less, more preferably about 120% or less, with respect to the thickness of other barrier layers. The thickness of about several % greater than the thickness of other barrier layers is sufficient and about 105% or greater is preferable. An increase in the thickness in the range as described above allows to exert an adequate function as the active layer and to prevent serial resistance component from growing excessively, so that deterioration in the light emitting efficiency of the active layer can be efficiently avoided. Particularly, increasing the thickness of the barrier layer at the p-side semiconductor layer side allows an improvement in the light emitting efficiency more significantly in light of a short wavelength side.

It is suitable that the active layer includes a unit cycle disposed on a side close to the n-side semiconductor layer and has a plurality of unit cycles having the same thickness and adjacent to each other, and further, includes a unit cycle disposed on a side close to the p-side semiconductor layer and a plurality of unit cycles having the same thickness and adjacent to each other. In other words, it is suitable that the active layer includes a barrier layer disposed on a side close to the n-side semiconductor layer, and a plurality of barrier layers having the same thickness as this barrier layer and adjacent to the barrier layer via the well layers respectively, and further includes a barrier layer disposed on a side close to the p-side semiconductor layer, and a plurality of barrier layers having the same thickness as this barrier layer and adjacent to the barrier layer via the well layers respectively.

That is, in the active layer, depending on the thickness of the barrier layer, at least, unit cycle groups of two kinds of thicknesses (or barrier layers of two kinds of thicknesses) are disposed. For example, in FIG. 2, two groups, a group which includes a unit cycle UN1 disposed on the side close to the n-side semiconductor layer, and a plurality of unit cycles (for example UN2, UN3, UN4) having a same thickness and being adjacent to each other, and a group which includes a unit cycle UP1 disposed on the side close to the p-side semiconductor layer, and a plurality of unit cycles (for example UP2) having a same thickness and being adjacent to each other, are disposed.

Here, a total number of the unit cycles including the unit cycle disposed at the closer side to the n-side semiconductor layer is preferably greater than the total number of the unit cycles including the unit cycle disposed at the closer side to the p-side semiconductor layer. In other words, the number of the unit cycles on the side close to the n-side semiconductor layer is preferably greater than the number of the unit cycles on the side close to the p-side semiconductor layer. In still other words, the number of the barrier layers disposed on the side close to the n-side semiconductor layer and have the same thickness with each other is preferably greater than the number of the barrier layers disposed on the side close to the p-side semiconductor layer. The unit cycles or the groups of barrier layers disposed on the side close to the n-side semiconductor layer is preferably 1.5 times or more, two times or more, or three times or more. In other words, one or more, two or more, three or more, four or more, or five or more is preferable. Accordingly, while sufficiently performing functions as an active layer, the light emitting efficiency can be improved without an increase in the serial resistance components.

In another respect, the total number of the unit cycles (or the barrier layers) including the unit cycles (or the barrier layers) disposed on the side close to the p-side semiconductor layer is suitably about 2 to 15, preferably about 2 to 10, and more preferably about 2 to 7. The total number of the unit cycles (or the barrier layers) including the unit cycles (or the barrier layers) disposed on the side close to the n-side semiconductor layer is suitably greater than the total number of the unit cycles (or the barrier layers) including the unit cycles (or the barrier layers) disposed on the side close to the p-side semiconductor layer and is about 3 to 45, preferably about 3 to 30, and more preferably about 3 to 10.

The first barrier layer adjacent to the n-side semiconductor layer and/or the final barrier layer adjacent to the p-side semiconductor layer as described above can be omitted, but the both are preferably employed. In this case, the first barrier layer and/or the final barrier layer may be disposed respectively as the two kinds of unit cycle groups or may be disposed as the barrier layers which are constituent of groups of barrier layers of two kinds of thickness. In the case of disposing as a constituent barrier layer of each group, it is preferable to adjust to an appropriate thickness according to the relationship of those thickness. Among those, the final barrier layer is preferably disposed as a barrier layer which is a constituent of a group.

In the case where disposing as the barrier layers not to constitute each group, the composition and/or the thickness may be different form other barrier layers constituent the group. Among those, the first barrier layer is preferably disposed as a barrier layer which is not a constituent of a group. In this case, the first barrier layer can be, for example, either a semiconductor layer including a p-type dopant or a non-dope semiconductor layer, and either of a single-layer structure or a stacked-layer structure. Preferably, a stacked layer structure in which a semiconductor layer including an n-type dopant and a non-dope semiconductor layer are stacked adjacent to the n-side semiconductor layer is preferable. The thickness in this case is for example, about 0.5 to 7 nm is suitable and the n-type dopant layer/non-doped layer is preferably about 0.3 to 5 nm/about 0.2 to 2 nm. Particularly, with the first barrier layer, which further has a greater thickness than the other barrier layers closer to the n-side semiconductor layer, crystal defects in the lower layers can be compensated, and the well layers of higher-quality, and thus the active layer of higher-quality can be stacked.

The active layer may form, between the well layer and the barrier layer, a cap layer 9 having a different composition from the well layer and the barrier layer. The cap layer is, for example, preferably formed with an AlGaN layer with respect to the InGaN well layer. The cap layer has a thickness of, for example, about 20 to 150% with respect to the well layer. Stacking a cap layer on the upper surface of a well layer allows to prevent indium from breakdown, and thus the light emitting efficiency can be improved.

In the active layer, depending on the thickness of the barrier layer, unit cycle groups of three or more kinds of thicknesses (or barrier layers of three kinds of thicknesses) may be disposed. In this case, for example, a group of unit cycles or a group of barrier layers having a thickness of unit cycle or a barrier layer which is between (for example, a middle) or greater than those or less than those, may be disposed between the above described groups of unit cycles of two kinds of thickness or groups of barrier layers of two kinds of thickness. As described above, addition of unit cycles or barrier layers having different thickness allows an increase in the number of the unit cycles or the number of the barrier layers, and a further reduction of resistivity factor, a reduction in the forward voltage Vf, and an improvement in the light emitting efficiency can be realized.

Moreover, the thickness of these can be changed with increasing the thickness in a step manner or gradually, from the unit cycles or the barrier layers disposed on the side close to the n-side semiconductor layer through the unit cycles or the barrier layers disposed on the side close to the p-side semiconductor layer.

Substrate

For the substrate 1, an insulating substrate such as a sapphire having C-plane, R-plane or A-plane as a main surface, other, spinel ($MgAl_2O_4$) etc, as well as a semiconductor substrate such as SiC (including 6H, 4H, and 3C), Si, ZnO, GaAs, GaN etc.) can be used. The substrate may have an off-angle. With the use of one with off-angled, an under layer can be grown with a good crystallinity, so that an n-side semiconductor layer, an active layer, and a p-side semiconductor layer of good quality can be stacked.

On the substrate 1, a buffer layer is preferably formed. Examples of the buffer layer include a nitride semiconductor made of $Ga_dAl_{1-d}N(0<d\leq1)$, a layer having an Al mixed crystal ratio of 0.3 or less is preferable and a layer having an Al mixed crystal ratio of 0.2 or less is more preferable. The smaller the Al mixed crystal ratio the more significant improvement in the crystallinity. More preferably, a buffer layer made of GaN can be exemplified. The buffer layer may finally be removed, or the buffer layer itself may be omitted.

In the case where the buffer layer is formed, its thickness is preferably about 0.002 to 0.5 μm, about 0.05 to 0.2 μm, further, about 0.01 to 0.02 μm is preferable. With this range, good crystalline morphology of a nitride semiconductor can be obtained and the crystallinity of the nitride semiconductor grown on the buffer layer can be improved. In the case where a buffer layer is grown, the temperature of 200 to 900° C. is suitable and a ranged of 400 to 800° C. is preferable. Accordingly, good polycrystal can be formed, and with this polycrystal as a seed crystal, the crystallinity of the semiconductor grown on the buffer layer can be improved.

On the buffer layer, a semiconductor layer for an under layer may be further formed. For example, it is preferable to have a nitride semiconductor layer having a dislocation density of $1 \times 10^7$ to $5 \times 10^9$ cm$^{-2}$. The nitride semiconductor layer is preferably a GaN layer, but an $Al_{1-x}Ga_xN$ layer (0<x<1) can be employed. The nitride semiconductor layer may be a single layer or of a stacked-layer structure with two or more layers. In the case where the nitride semiconductor layer is formed with a stacked-layer structure, layers having different compositions and/or employing different forming methods are preferable. With this, dislocation density can be reduced and crystallinity can be improved.

The nitride semiconductor layer has a thickness of, for example, preferably about 1 μm or greater, more preferably about 2 μm or greater, about 3 μm or greater, preferably about 10 μm or less, and more preferably about 5 μm or less.

n-Side Semiconductor Layer

In the n-side semiconductor layer, from the substrate 1 side, generally, an n-type contact layer and an n-type cladding layer are stacked in this order.

n-Type Contact Layer

The component of the n-type contact layer is not specifically limited, and for example, a layer made of AlGaN or GaN with an Al ratio of 0.2 or less is preferable, and a layer made of a single layer is more preferable. With such a composition, a nitride semiconductor layer having low crystal defects becomes easier to obtain.

The thickness of the contact layer is not specifically limited, and for example, about 1 μm or greater, preferably about 3 μm or greater can be employed. The n-type contact layer contains an n-type dopant, and the concentration thereof is preferably high to a degree not to deteriorate the crystallinity of the nitride semiconductor. For example, $1 \times 10^{18}$/cm$^3$ or greater, $5 \times 10^{21}$/cm$^3$ or less can be exemplified.

n-Type Cladding Layer

The n-type cladding layer can have a single layer structure, but can be made with nitride semiconductors having different compositions and containing at least two elements, for example, layers expressed by the above-described formula (A). Specifically, the n-type cladding layer is preferably made of a superlattice multi-layer, and more preferably made of a superlattice layer in which layers of two different compositions, $Al_zGa_{1-z}N$ (0<z<1) (first layer) and $In_pGa_{1-p}N$ (0<p<1) (second layer), are alternately stacked. Either the first layer or the second layer can be the lowermost layer and/or the uppermost layer. Here, the composition among the first layers, among the second layers, among the first layers and the second layers, or of all the layers is not necessarily the same, and the compositions of those layers may change partially, gradiently, stepwisely, or alternately. Among those, the first layers and the second layers preferably have the same composition.

In the first layer, the smaller z, that is, the smaller the aluminum content, the better crystal quality, so that in order to achieve a good crystallinity, a layer made of GaN with z=0 is preferable. The second layer is preferably a layer in which p is 0.5 or less, and more preferably a layer in which p is 0.2 or less. Among those, for the n-type cladding layer, a superlattice multi layer in which the first layer is GaN and the second layer is $In_pGa_{1-p}N$ where p is 0.2 or less, is preferable.

In this case, the layers having different compositions (preferably the first layer and the second layer described above) are, for example, a stacked layer of a total of 20 or more layers made with 10 or more stacked layers of each is suitable and a stacked layer with 20 or more layers of each (a total of 40 or more layers) is preferable. A maximum number of stacking of the first layers and the second layers is not specifically limited, but for example, 500 layers or less is suitable and 200 layers or less, 100 layers or less is preferable. Disposing such an n-type cladding layer allows realization of efficient reduction in the Vf.

The thicknesses of the layers constituting the cladding layer are not specifically limited, but a total thickness of about 50 nm or greater is suitable, and about 65 nm or greater is preferable, and about 75 nm or greater, about 80 nm or greater are more preferable, further, about 90 nm or greater is further more preferable. A maximum of the total thickness is not specifically limited, but in view of the manufacturing efficiency and improvement in performance, about 500 nm or less can be employed, and about 400 nm or less is preferable. With the total thickness in the range as described above, good crystallinity can be obtained and the output power of the element can be improved.

The n-type cladding layers are not necessarily contain an n-type dopant in all the layers and it is sufficient that the n-type dopant is contained in at least one layer. For example, either one of the first layers or the second layers described above may not contain an n-type dopant or all the layers may contain an n-type dopant. In this case, the type and the concentration of dopant is not necessarily of the same in all the layers, and may differ in the layers or may differ at least in one layer. For example, a modulation doping in which an n-type dopant is doped in both the first layers and the second layers described above with different concentrations in the adjacent nitride semiconductor layers tends to allow a further improvement in the optical output.

The concentration of the dopant can be $5 \times 10^{16}$/cm$^3$ or greater, $3 \times 10^{18}$/cm$^3$ or greater, and $5 \times 10^{18}$/cm$^3$ or greater is preferable. A maximum of the n-type dopant concentration is not specifically limited, but is preferably to a degree not to decrease the crystallinity, for example, $5 \times 10^{21}$/cm$^3$ or less, or $1 \times 10^{20}$ cm$^3$ or less. With such a dopant concentration, the Vf can be further reduced.

The method of forming the n-type cladding layer is not specifically limited, and a known method, for example, any one of a MOVPE, a Metalorganic Chemical Vapor Deposition (MOCVD) growth method, a Hydride Vapor Phase Epitaxy (HVPE) growth method, and a Molecular Beam Epitaxial (MBE) growth method can be employed. The layer formation temperature is not specifically limited, but is preferably 850° C. or greater, more preferably 900° C. or greater. With this arrangement, the crystallinity can be further improved.

p-Side Semiconductor layer

It is preferable that the p-side semiconductor layer includes a p-side cladding layer and a p-type contact layer in this order from the active layer side, for example.

p-Side Cladding Layer

The p-side cladding layer can be a single layer or a stacked layer of at least two layers having different band gap energies, or a superlattice multilayer, represented by the formula (A) described above and containing a p-type dopant. Among those, a single layer or a stacked layer of at least two layers having different band gap energies made of $Al_bGa_{1-b}N$ ($0 \leq b \leq 1$) is preferable. The p-side cladding layer preferably has a p-type dopant concentration of about $1\times 22/cm^3$ or less, more preferably about $5\times 10^{20}/cm^3$ or less. A minimum of the p-type dopant concentration is not specifically limited, but about $5\times 10^{16}/cm^3$ or greater is suitable. In the stacked layer or the superlattice multilayer, a p-type dopant is not necessarily contained in all layers. Further, the p-type dopant concentration may be either different or the same in each layer or in a part of the layers.

The thickness of the cladding layer is not specifically limited and about 10 nm or greater may be employed. In the stacked layer or the superlattice multilayer, a single nitride semiconductor layer preferably has a thickness of about 10 nm or less, about 7 nm or less, or more preferably about 5 nm or less. Forming with thin layers allows the multilayer to obtain a superlattice structure and the crystallinity of the multilayer can be improved. As a result, in the case where a p-type dopant is added, a layer having a large carrier concentration and a small resistivity can be obtained, and the Vf and the threshold etc., of the element tend to decrease. Accordingly, a good optical output can be obtained with low power consumption.

P-Type Contact Layer

The p-type contact layer can be a layer made of, for example, an nitride semiconductor represented by the formula (A) described above, and particularly, a layer made of GaN, AlGaN with an Al ratio of 0.2 or less, or InGaN with an In ratio of 0.2 or less is preferable, and a layer made of GaN is more preferable. The compositions described above can provide good ohmic contact with an electrode material.

The thickness of the p-type contact layer 10 is not specifically limited, and for example, about 50 nm or greater is preferable and about 60 nm or greater is more preferable, and the dopant concentration can be, for example, $1\times 10^{18}/cm^3$ or greater and $5\times 10^{21}/cm^3$ or less.

Electrode

The full-surface electrode, the p-electrode, and the n-electrode used in the semiconductor light emitting element according to the present invention are not specifically limited in their compositions of the single layer, compositions and stacking order of the stacked-layer structure, and the thicknesses etc., and any of that known in the art can be employed. Particularly, the full-surface electrode is, in consideration of the light extraction efficiency, preferably made of a material which does not absorb light emitted from the active layer, and for example, an electrically conductive oxide (ITO etc.) can be used.

Protective Layer

For the protective layer, the material and the thickness are not specifically limited, and for example, a single layer or a multilayer etc., made of such as $SiO_2$, $ZrO_2$, $TiO_2$, $Al_2O_3$, $Nb_2O_5$, AlN, AlGaN can be employed. It is preferable to adjust the thickness of the layer appropriately.

Examples of the semiconductor light emitting element according to the present invention will be described below, but the present invention is not limited to the examples described below.

EXAMPLES 1A AND 1B

The semiconductor light emitting element according to the present example is constituted with, as shown in FIG. 1, in which, on a substrate made of sapphire 1, a buffer layer made of undoped AlGaN (thickness: about 15 nm), an intermediate layer made of undoped GaN (thickness: about 3.5 μm), an n-type contact layer made of GaN doped with Si of $9\times 10^{18}/cm^3$ (thickness: 4.2 μm), and a GaN layer r doped with Si of $2.5\times 10^{18}/cm^3$ (thickness: 4 nm) are stacked, then, an undoped $In_{0.02}Ga_{0.98}N$ layer q (thickness: 2 nm) and a GaN layer r doped with Si of $2.5\times 10^{18}/cm^3$ (thickness: 4 nm) are in this order stacked thereon, to form an n-side cladding layer (thickness: 364 nm) of a superlattice structure having a total of 121 layers, in which a stacked-layer of the GaN layer q and the GaN layer r are repeatedly stacked. Then, an active layer (thickness: about 75 nm thickness), a p-side cladding layer (thickness: about 25 nm) made of a p-type $Al_{0.2}Ga_{0.8}N$ doped with Mg of $1\times 10^{20}/cm^3$, and a p-type contact layer in which a layer made of undoped GaN (thickness: about 50 nm), a layer (thickness: about 50 nm) made of p-type GaN doped with Mg of $1\times 10^{20}/cm^3$, and a layer (thickness: about 15 nm) made of p-type GaN doped with Mg of $5\times 10^{20}/cm^3$ are stacked in this order.

The active layer in the stacked layer structure described above has a multiquantum well structure constituted with a first barrier layer having a stacked layer structure including a layer (thickness: about 4 nm) made of GaN doped with Si of $5\times 10^{18}/cm^3$, a layer (thickness: about 3.5 nm) made of undoped GaN, a stacked layer structure on the first barrier layer, made of 6 cycles of a unit cycle of a well layer g (thickness: about 3.3 nm) made of undoped $In_{0.2}Ga_{0.8}N$ and a barrier layer h (thickness: about 5.0 nm) made of undoped GaN, and a stacked layer structure on the above stacked layer, made of 3 cycles of a unit cycle of a well layer w (thickness: about 3.3 nm) made of undoped $In_{0.2}Ga_{0.8}N$ and a barrier layer t (thickness: about 5.25 nm) made of undoped GaN.

Then, a part of the p-side semiconductor layer, active layer, and n-side semiconductor layer are removed to expose a surface of the n-type contact layer. On the approximately entire surface, a full-surface electrode 6 made of ITO is formed, and a p-electrode 7 containing Ti, Rh, and Au is formed thereon, and on the surface of exposed contact layer, an n-electrode 8 made of the same stacked layer materials as the p-electrode is formed.

Such a semiconductor light emitting element 10 described above can be manufactured according to a method described below.

Substrate

A substrate 1 made of sapphire (C-plane) is set in a MOCVD reaction vessel. Then, under a flow of hydrogen, the temperature of the substrate is raised to about 900° C. to 1200° C. to clean the substrate.

Buffer Layer

Subsequently, at a temperature of about 500° C., by using hydrogen as a carrier gas, ammonia, TMG (trimethylgallium), and TMA (trimethylaluminum) as a row material gas, a buffer layer made of undoped $Al_{0.05}Ga_{0.95}N$ is grown to a thickness of about 1.5 μm on a substrate.

Intermediate Layer

Subsequently, at a temperature of about 800° C., by using hydrogen as a carrier gas, ammonia and TMG (trimethylgallium) as a row material gas, an intermediate layer made of undoped GaN is grown to a thickness of about 3.5 μm on the buffer layer.

n-Type Contact Layer

Next, by using TMG and ammonia gas as the material gases and silane gas as a dopant, an n-type contact layer made of GaN doped with Si is grown to a thickness of about 4 μm.

n-Type Cladding Layer

Next, at a temperature about 800° C. to 1000° C., using TMG and ammonia, a non-doped GaN layer (thickness: 2 nm) is stacked on the Si-doped GaN layer (thickness: 4 nm).

Active Layer

Next, as a barrier layer, a layer made of GaN containing Si is grown about 4 nm, and a layer made of undoped GaN is grown to a thickness of about 3.5 nm. Then, using TMG, TMI, and ammonia, 6 layers each of a well layer made of undoped $In_{0.2}Ga_{0.8}N$ with a thickness of about 3.3 nm and a barrier layer made of undoped GaN with a thickness of about 4.4 nm are alternately stacked, and further, 3 layers (that is, the 7th layer to the 9th layer) each of a well layer made of undoped $In_{0.2}Ga_{0.8}N$ with a thickness of about 3.3 nm and a barrier layer made of undoped GaN with a thickness of about 5.25 (1.05 times greater thickness) nm are alternately stacked. Thus, an active layer made of a multiquantum well structure with 9 cycles (total thickness: about 75 nm) of a unit cycle of a well layer and a barrier layer, is grown.

p-Type Cladding Layer

Next, using TMG, TMA, ammonia, and $Cp_2Mg$ (cyclopentadienylmagnesium), a p-side cladding layer made of Mg-doped p-type $Al_{0.2}Ga_{0.8}N$ is grown to a thickness of about 15 nm.

P-Type Contact Layer

Next, at a temperature of about 900° C. to 1000° C., using TMG, TMA, and ammonia, a layer made of an undoped GaN is grown to a thickness of about 50 nm, and on this, using TMG, ammonia, $Cp_2Mg$, a layer made of a Mg-doped p-type GaN is grown to a thickness of about 50 nm, and further on this, a Mg-doped p-type GaN is grown to a thickness of about 15 nm.

After the reaction is completed, the temperature is lowered to room temperature. Then, a wafer is placed in a reaction vessel and in a nitrogen atmosphere, annealing is carried out at 300° C. to 700° C. to further reduce the resistance of the p-side layer. Then, the wafer is taken out from the reaction chamber and is provided with a mask on the surface of the p-type contact layer, which is the uppermost layer. Then, by using an RIE (reactive ion etching) apparatus, etching is performed from the p-type contact layer side to expose the surface of the n-type contact layer.

Next, a light-transmissive full-surface electrode made of ITO is formed on the approximately entire surface of the p-type contact layer which is the uppermost layer. On the full-surface electrode and the n-type contact layer exposed by the p-etching, a stacked layer including Ti, Rh, and Au is disposed, and by way of patterning, a p-electrode and an n-electrode are respectively formed.

The stacked-layer structure thus obtained is cut into individual chips, and thus, for example, semiconductor light emitting elements with an emission wavelength of 440 nm to 480 nm were obtained. Also, semiconductor light emitting elements having a similar structure as in the Example 1a described above were formed (Example 1b), except that the greater thickness of the barrier layers was set to a 1.1 times (5.5 nm) greater thickness instead of the 1.05 times (5.25 nm) thickness.

EXAMPLES 2A AND 2B

Semiconductor light emitting elements having a similar structure were obtained, except that in the active layer, the thickness of the barrier layers in the 5th to 9th layers was set to 1.05 times (Example 2a) and 1.1 times (Example 2b), and 9 cycles (thickness of the layer: 76 nm and 77 nm) of the well layers and the barrier layers were stacked.

EXAMPLES 3A AND 3B

Semiconductor light emitting elements having a similar structure were obtained, except that in the active layer, the thickness of the barrier layers in the 3rd to 9th layers was set to 1.05 times (Example 3a) and 1.1 times (Example 3b), and 9 cycles (thickness of the layer: 76.5 nm and 78 nm) of the well layers and the barrier layers were stacked.

COMPARATIVE EXAMPLE 1

Semiconductor light emitting elements having a similar structure were obtained, in which, except that in the active layer, without changing the thickness of the barrier layers, 9 cycles (thickness of the layer: 75 nm) of well layers and barrier layers were stacked.

Evaluation of Semiconductor Light Emitting Element

Figure 3:
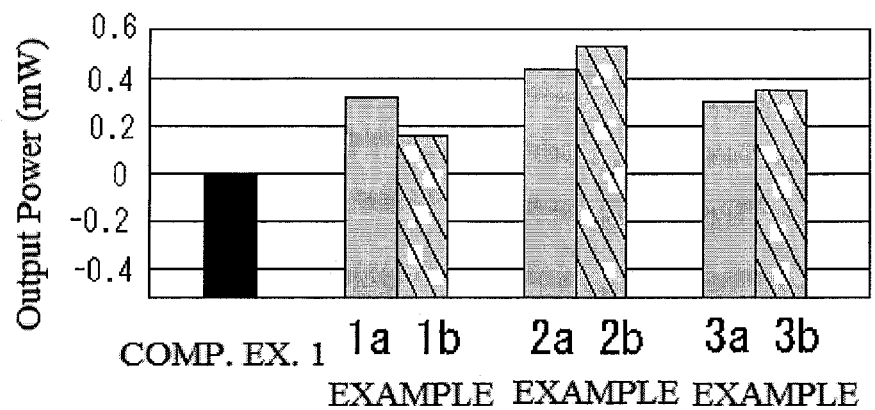
FIG. 3 is a graph showing a result regarding Vf of the semiconductor light emitting element of an example of the present invention.
Figure 4:
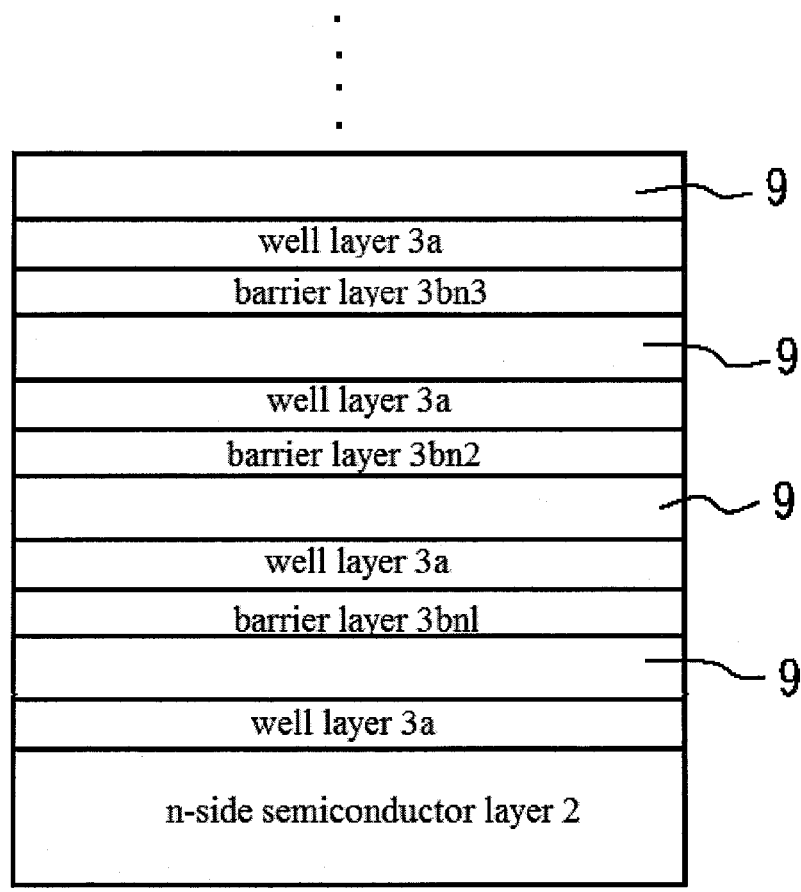
FIG. 4 is a schematic cross sectional view of main portions, for illustrating a structure of a semiconductor light emitting element according to another embodiment of the present invention.

The forward voltage and output of the semiconductor light emitting elements obtained by Examples 1a to 3b and Comparative Example 1 described above were measured. The evaluation was performed on the chips with a size of 500×290 μm while applying forward current of 20 mA in pulse mode. The result is shown in FIG. 3. In FIG. 3, the white bars show the outputs of the light emitting elements having the active layer with the barrier layers of a 1.05 times greater thickness, the bars with hatched lines show the outputs of the light emitting elements having the active layer with the barrier layers of a 1.1 times greater thickness. With the output of the light emitting element of Comparative Example assumed as a standard, an increase of about 0.2 to 0.5 mV was confirmed in any one of Example 1a to Example 3b. Also, all the Examples above exhibited the VF values equal or lower than the Vf of Comparative Example. According to the results as described above, balancing a reduction in the Vf and an improvement in the output, a further higher light emitting efficiency can be realized.

The semiconductor light emitting element according to the embodiments can be applied, for example, as a height luminosity blue LED, a pure green LED, etc., to various light sources such as a full-color LED display, a traffic signal, an image scanner, etc.

The invention claimed is:

1. A semiconductor light emitting element comprising:
   a substrate;
   an n-side semiconductor layer stacked on the substrate;
   an active layer stacked on the n-side semiconductor layer; and
   a p-side semiconductor layer stacked on the active layer,
   the active layer having a multiple quantum well structure including a plurality of barrier layers and a plurality of well layers adjacent to the barrier layers,
   the barrier layers including a final barrier layer, at least one nearest barrier layer, and a plurality of n-side barrier layers,
   the final barrier layer being disposed closest to the p-side semiconductor layer,
   the at least one nearest barrier layer being nearest to the final barrier layer,
   the n-side barrier layers being disposed nearer to the n-side semiconductor layer than both the final barrier layer and the at least one nearest barrier layer,
   each of the n-side barrier layers having a constant thickness that is thinner than both the final barrier layer and the at least one nearest barrier layer, and
   the final barrier layer and the at least one nearest barrier layer being equally thick.

2. A semiconductor light emitting element comprising:
   a substrate;
   an n-side semiconductor layer stacked on the substrate;
   an active layer stacked on the n-side semiconductor layer; and
   a p-side semiconductor layer stacked on the active layer,
   the active layer having a multiple quantum well structure including a plurality of unit cycles of a barrier layer and a well layer adjacent to the barrier layer; and
   the plurality of unit cycles including a final unit cycle, at least one nearest unit cycle, and a plurality of n-side unit cycles,
   the final unit cycle being disposed closest to the p-side semiconductor layer,
   the at least one nearest unit cycle being nearest to the final unit cycle,
   the n-side unit cycles being nearer to the n-side semiconductor layer than both the final unit cycle and the at least one nearest unit cycle,
   the barrier layer of each of the n-side unit cycles having a constant thickness that is thinner than both the barrier layer of the final unit cycle and the barrier layer of the at least one nearest unit cycle, and
   the barrier layer of the final unit cycle and the barrier layer of the at least one nearest unit cycle being equally thick.

3. The semiconductor light emitting element according to claim 2, wherein
   among the plurality of unit cycles in the active layer, a plurality of the unit cycles disposed on a side close to the n-side semiconductor layer and adjacent to each other have a first thickness, and a plurality of the unit cycles disposed on a side close to the p-side semiconductor layer and adjacent to each other have a second thickness,
   a total number of the unit cycles disposed on the side close to the n-side semiconductor layer is greater than a total number of the unit cycles disposed on the side close to the p-side semiconductor layer.

4. The semiconductor light emitting element according to claim 3, wherein
   the barrier layer in one of the unit cycles disposed on the side close to the p-side semiconductor layer has a greater thickness than the barrier layer in one of the unit cycles disposed on the side close to the n-side semiconductor layer.

5. The semiconductor light emitting element according to claim 4, wherein
   the barrier layer in one of the unit cycles disposed on the side close to the p-side semiconductor layer has a thickness of 1.5 times or greater with respect to a thickness of the well layer in the one of the unit cycles disposed on the side close to the p-side semiconductor layer.

6. The semiconductor light emitting element according to claim 1, wherein
   the barrier layers in the active layer include
      a barrier layer disposed on a side close to the n-side semiconductor layer having a first thickness,
      a plurality of the barrier layers having the first thickness, and adjacent to the barrier layer close to the n-side semiconductor layer with well layers being interposed between adjacent ones of the plurality of barrier layers,
      a barrier layer disposed on a side close to the p-side semiconductor layer having a second thickness,
      a plurality of the barrier layers having the second thickness, and adjacent to the barrier layer close to the p-side semiconductor layer with well layers being interposed between adjacent ones of the plurality of barrier layers, and
      a number of the barrier layers disposed on the side close to the n-side semiconductor layer having the first thickness is greater than a number of the barrier layers disposed on the side close to the p-side semiconductor layer having the second thickness.

7. The semiconductor light emitting element according to claim 1, wherein
   the final barrier layer has the thickness 1.5 times or more greater than a thickness of an adjacent one of the well layers.

8. The semiconductor light emitting element according to claim 1, wherein
   the barrier layers and the well layers are alternately stacked.

9. The semiconductor light emitting element according to claim 1, wherein
   the well layers are made of an undoped InGaN and the barrier layers are made of an undoped nitride semiconductor having a larger band gap energy than the well layers.

10. The semiconductor light emitting element according to claim 1, wherein
    the well layers are made of an undoped InGaN, and the barrier layers are made of an undoped GaN, an undoped AlGaN, or an undoped InGaN having a lower In mixed crystal ratio than the well layers.

11. The semiconductor light emitting element according to claim 9, wherein
    the well layers have an In mixed crystal ratio of 0.1 or greater and 0.4 or less.

12. The semiconductor light emitting element according to claim 1, wherein
    the active layer further includes a plurality of cap layers having a different composition than the well layers and the barrier layers with the cap layers being respectively disposed between the well layers and the barrier layers.

13. The semiconductor light emitting element according to claim 2, wherein the well layers are made of an undoped InGaN and the barrier layers are made of an undoped nitride semiconductor having a larger band gap energy than the well layers.

14. The semiconductor light emitting element according to claim 2, wherein
the well layers are made of an undoped InGaN, and the barrier layers are made of an undoped GaN, an undoped AlGaN, or an undoped InGaN having a lower In mixed crystal ratio than the well layers.

15. The semiconductor light emitting element according to claim 14, wherein
the well layers have an In mixed crystal ratio of 0.1 or greater and 0.4 or less.

16. The semiconductor light emitting element according to claim 2, wherein
each of the unit cycles in the active layer further includes a cap layer having a different composition than the well layer and the barrier layer with the cap layer being disposed between the well layer and the barrier layer.

17. The semiconductor light emitting element according to claim 1, wherein
all of the well layers are equally thick.

18. The semiconductor light emitting element according to claim 1, wherein
the nearest barrier layer is undoped.

* * * * *